United States Patent
Cheng

(10) Patent No.: US 10,714,684 B2
(45) Date of Patent: Jul. 14, 2020

(54) PHASE CHANGE MEMORY WITH DOPED SILICON GERMANIUM ALLOY-CONTAINING ELECTRODES AND AIR GAP-CONTAINING SPACER

(71) Applicant: International Business Machines Corporation, Armonk, NY (US)

(72) Inventor: Kangguo Cheng, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/025,534

(22) Filed: Jul. 2, 2018

(65) Prior Publication Data
US 2020/0006652 A1   Jan. 2, 2020

(51) Int. Cl.
*H01L 45/00* (2006.01)

(52) U.S. Cl.
CPC .......... *H01L 45/1233* (2013.01); *H01L 45/06* (2013.01); *H01L 45/1293* (2013.01); *H01L 45/14* (2013.01); *H01L 45/16* (2013.01)

(58) Field of Classification Search
CPC ..... H01L 45/1233; H01L 45/06; H01L 45/16; H01L 45/1293; H01L 45/14
See application file for complete search history.

(56) References Cited

U.S. PATENT DOCUMENTS

| 7,884,347 B2 | 2/2011 | Yoon et al. |
| 8,026,503 B2 | 9/2011 | Tu |
| 8,241,992 B2 | 8/2012 | Clevenger et al. |
| 8,288,750 B2 | 10/2012 | Shen et al. |
| 8,609,503 B2 | 12/2013 | Lee et al. |
| 9,029,828 B2 | 5/2015 | Oh |
| 9,660,188 B2 | 5/2017 | Lin et al. |
| 2008/0135825 A1 | 6/2008 | Lee et al. |
| 2011/0266511 A1* | 11/2011 | Shen ............... H01L 45/06 257/3 |

(Continued)

FOREIGN PATENT DOCUMENTS

CN   103682094 A   3/2014

OTHER PUBLICATIONS

Sadeghipour, S., et al., "Phase Change Random Access Memory, Thermal Analysis", IEEE The Tenth Intersociety Conference on Thermal and Thermomechanical Phenomena in Electronics Systems, Date of Conference: May 30-Jun. 2, 2006, pp. 660-665, Conference Location: San Diego, CA.

*Primary Examiner* — Su C Kim
(74) *Attorney, Agent, or Firm* — Scully, Scott, Murphy & Presser, P.C; L. Jeffrey Kelly, Esq.

(57) ABSTRACT

A PCM cell is provided that includes a phase change memory material that is sandwiched between top and bottom electrodes which are both composed of a doped silicon germanium alloy. A doped silicon germanium alloy has good electrical conductivity, while having a lower thermal conductivity than conventional conductive materials such as TiN or W that are typically used in PCM cells. The presence of the doped silicon germanium alloy mitigates heat loss in the PCM cell thus reducing reset current and, in some embodiments, thermal cross-talk between adjacent PCM cells. Further reduction of heat loss can be obtained by providing an airgap-containing dielectric spacer laterally adjacent to the PCM cell.

18 Claims, 4 Drawing Sheets

(56) References Cited

U.S. PATENT DOCUMENTS

2011/0312151 A1* 12/2011 Herner .................. H01L 45/148
  438/384
2016/0163975 A1* 6/2016 Petz ...................... H01L 45/141
  257/4
2016/0225824 A1* 8/2016 Jo ........................ H01L 45/1233

* cited by examiner

PHASE CHANGE MEMORY WITH DOPED SILICON GERMANIUM ALLOY-CONTAINING ELECTRODES AND AIR GAP-CONTAINING SPACER

BACKGROUND

The present application relates to a semiconductor structure and a method of forming the same. More particularly, the present application relates to a semiconductor structure including a phase change memory (PCM) cell having a reduced reset current and reduced thermal cross-talk.

Phase change memory (PCM) has emerged as a viable technology to fill the memory application gap between volatile memory and flash memory. PCM is a type of non-volatile random access memory (NVRAM). A NVRAM retains its information when the power is turned off. This is in contrast to dynamic random access memory (DRAM) and static random access memory (SRAM), which both maintain data only for as long as power is applied.

A typically PCM includes a material stack of, and from bottom to top, a bottom electrode, a phase change memory material that exhibits a change in atomic order (from crystalline to amorphous, or vice versa), and a top electrode. The top and bottom electrodes are composed of a conductive material such as, for example, titanium nitride (TiN) or tungsten (W). Such conductive materials are also thermal conductors so heat loss occurs through the top and bottom electrodes of the PCM cell.

Heat loss in a PCM cell causes the following two issues, which are problematic in PCM cells. First, due to heat loss higher current is required to reset a PCM cell and thus higher power consumption is needed. Second, and for a highly scaled PCM cell array in which PCM cells are closely packed, heat from a PCM cell during the reset operation may transfer to adjacent PCM cells, undesirably disturbing the adjacent PCM cells. There is thus a need for providing PCM cells in which heat loss is mitigated thus reducing reset current and thermal cross-talk between adjacent PCM cells.

SUMMARY

A PCM cell is provided that includes a phase change memory material that is sandwiched between top and bottom electrodes which are both composed of a doped silicon germanium alloy. A doped silicon germanium alloy has good electrical conductivity, while having a lower thermal conductivity than conventional conductive materials such as TiN or W that are typically used in PCM cells. The presence of the doped silicon germanium alloy mitigates heat loss in the PCM cell thus reducing reset current and, in some embodiments, thermal cross-talk between adjacent PCM cells. Further reduction of heat loss can be obtained by providing an airgap-containing dielectric spacer laterally adjacent to the PCM cell.

In one aspect of the present application, a semiconductor structure is provided. In one embodiment of the present application, the semiconductor structure includes a phase change memory cell located on a surface of a semiconductor substrate. The phase change memory cell of the present application includes a phase change material sandwiched between a bottom electrode structure and a top electrode structure. Each of the bottom electrode structure and the top electrode structure of the phase change memory cell includes a doped silicon germanium alloy electrode positioned between a top diffusion barrier material and a bottom diffusion barrier material.

In another aspect of the present application, a method of forming a semiconductor structure is provided. In one embodiment, the method includes providing a phase change memory cell on a surface of a semiconductor substrate. The phase change memory cell of the present application includes a phase change material sandwiched between a bottom electrode structure and a top electrode structure. Each of the bottom electrode structure and the top electrode structure of the phase change memory cell includes a doped silicon germanium alloy electrode positioned between a top diffusion barrier material and a bottom diffusion barrier material.

DETAILED DESCRIPTION

Figure 2:
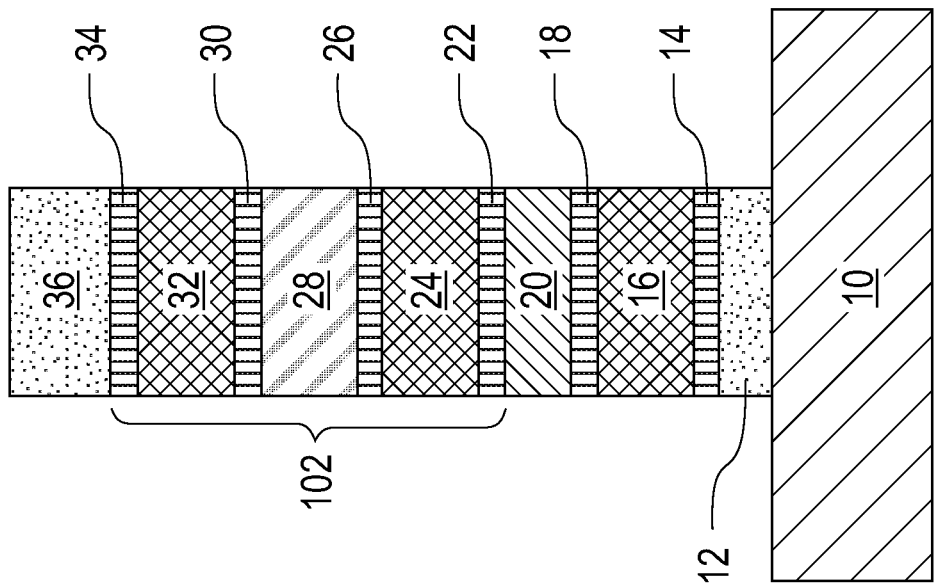
FIG. 2 is a cross sectional view of the exemplary semiconductor structure of FIG. 1 after patterning the PCM material stack.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1:
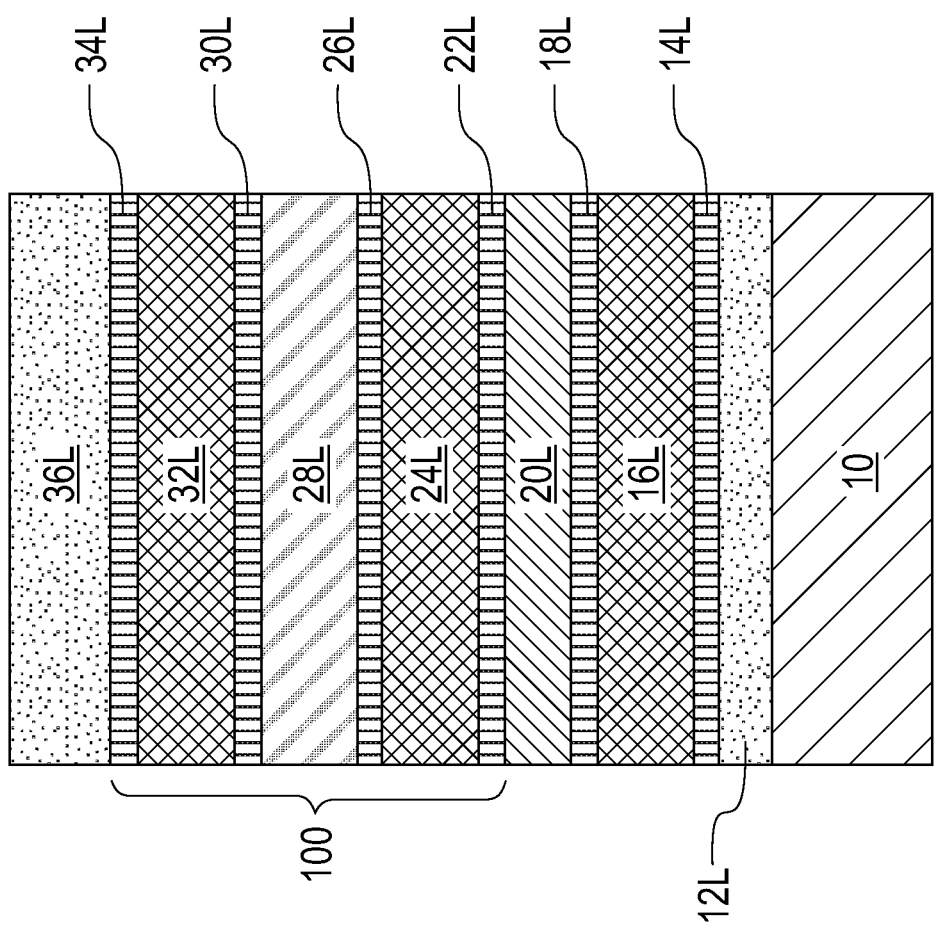
FIG. 1 is a cross sectional view of an exemplary semiconductor structure in accordance with the present application and during an early stage of fabrication, wherein the exemplary semiconductor structure includes a PCM material stack located on a surface of a semiconductor substrate.

Referring now to FIG. 1, there is illustrated an exemplary semiconductor structure in accordance with the present application and during an early stage of fabrication, wherein the exemplary semiconductor structure includes a PCM material stack 100 located on a surface of a semiconductor substrate 10.

The semiconductor substrate 10 that can be employed in the present application includes at least one semiconductor material that has semiconducting properties. Examples of semiconductor materials that can be used as the semiconductor substrate 10 include, for example, silicon (Si), a silicon germanium (SiGe) alloy, a silicon germanium carbide (SiGeC) alloy, germanium (Ge), III/V compound semiconductors or II/VI compound semiconductors. In one embodiment, the semiconductor substrate 10 is a bulk semiconductor substrate. The term "bulk semiconductor substrate" denotes a substrate that is composed entirely of one or more semiconductor materials. In one example, the bulk semiconductor substrate is composed entirely of Si.

In some embodiments, the semiconductor substrate 10 is composed of a semiconductor-on-insulator substrate (SOI). A SOI substrate typically includes a handle substrate, an insulator layer and a topmost semiconductor material layer. In some embodiments, the handle substrate of the SOI may include a semiconductor material, as described above. In other embodiments, the handle substrate may be omitted, or the handle substrate may be composed of a conductive material and/or an insulator material. The insulator layer of the SOI substrate may include a crystalline or non-crystalline dielectric material. In one example, the insulator layer of the SOI substrate may be composed of silicon dioxide and/or boron nitride. The topmost semiconductor layer of the SOI substrate is composed of a semiconductor material, as defined above.

Although not shown, the semiconductor substrate 10 may be processed to include one or more semiconductor devices such as, for example, transistors, capacitors, diodes, resistors, conductive wires, and the like. The semiconductor substrate 10 may also include one or more isolation structures such as, for example, a trench isolation structure, formed therein.

The PCM material stack 100 includes, from bottom to top, a first diffusion barrier layer 22L, a first doped silicon germanium alloy layer 24L, a second diffusion barrier layer 26L, a phase change memory layer 28L, a third diffusion barrier layer 30L, a second doped silicon germanium alloy layer 32L, and a fourth diffusion barrier layer 34L. In some embodiments, a second electrically conductive metal or metal alloy containing layer 36L is located on the PCM material stack 100, and a first electrically conductive metal or metal alloy containing layer 12L, a fifth diffusion barrier layer 14L, a third doped silicon germanium alloy layer 16L, a sixth diffusion barrier layer 18L, and a selector-containing layer 20L are located beneath the PCM material stack 100. In some embodiments, any one of the second electrically conductive metal or metal alloy containing layer 36L, the first electrically conductive metal or metal alloy containing layer 12L, the third doped silicon germanium alloy layer, (and the associated fifth and sixth diffusion barrier layers 14L, 18L), and the selector-containing layer 20L can be omitted from the exemplary structure.

The first electrically conductive metal or metal alloy containing layer 12L can be composed of any conductive metal or metal alloy. Examples of conductive metals that can be used as the first electrically conductive metal or metal alloy containing layer 12L include, but are not limited to, copper (Cu), aluminum (Al), tungsten (W) or cobalt (Co). An example of a conductive metal alloy that may be used as the first electrically conductive metal or metal alloy containing layer 12L includes a copper-aluminum alloy. The first electrically conductive metal or metal alloy containing layer 12L may include a single layered structure composed entirely of one conductive metal or metal alloy or a multi-layered structure containing at least two different conductive materials stacked one atop the other.

The first electrically conductive metal or metal alloy containing layer 12L can be formed utilizing a deposition process such as, for example, chemical vapor deposition (CVD), plasma enhanced chemical vapor deposition (PECVD), atomic layer deposition (ALD), sputtering or plating. The first electrically conductive metal or metal alloy containing layer 12L typically has a thickness from 10 nm to 200 nm; although other thicknesses for the first electrically conductive metal or metal alloy containing layer 12L are contemplated and can be used in the present application.

In the present application, a diffusion barrier layer is formed above and below each doped silicon germanium alloy layer that is present in the exemplary structure so as to prevent unwanted out-diffusion of dopant from the doped silicon germanium alloy layer. The various diffusion barrier layers (14L, 18L, 22L, 26L, 30L and 34L) are composed of a diffusion barrier material than can prevent diffusion of dopant from the doped silicon germanium alloy layer into the other material layers of the exemplary structure. Examples of such diffusion barrier materials that can be used as in providing the various diffusion barrier layers (14L, 18L, 22L, 26L, 30L and 34L) include, but are not limited to, tantalum (Ta), tantalum nitride (TaN), titanium (Ti), titanium nitride (TiN), ruthenium (Ru), ruthenium nitride (RuN), a ruthenium tantalum (RuTa) alloy, RuTaN, or tungsten nitride (WN). In some embodiments, TiN or TaN is used as the diffusion barrier material for each of the various diffusion barrier layers (14L, 18L, 22L, 26L, 30L and 34L).

The various diffusion barrier layers (14L, 18L, 22L, 26L, 30L and 34L) can be formed utilizing a deposition process such as, for example, CVD, PECVD, ALD, sputtering or plating. The various diffusion barrier layers (14L, 18L, 22L, 26L, 20L and 24L) can have a thickness from 10 nm to 25 nm; however other thicknesses are contemplated and can be used as the thickness for each of the various diffusion barrier layers (14L, 18L, 22L, 26L, 30L and 34L). The various diffusion barrier layers (14L, 18L, 22L, 26L, 30L and 34L) may comprise a same or different diffusion barrier material, and/or they may have a same or a different thickness.

The first, second and third doped silicon germanium alloy layers (16L, 24L, 32L) are composed of a silicon germanium alloy that contains a p-type dopant or an n-type dopant. The term "p-type" refers to the addition of impurities to an intrinsic semiconductor that creates deficiencies of valence electrons. In a silicon-containing semiconductor material such as a silicon germanium alloy, examples of p-type dopants, i.e., impurities, include, but are not limited to, boron, aluminum, gallium and indium. "N-type" refers to the addition of impurities that contributes free electrons to an intrinsic semiconductor. In a silicon containing semiconductor material such as a silicon germanium alloy, examples of n-type dopants, i.e., impurities, include, but are not limited to, antimony, arsenic and phosphorous. In one example, a boron doped silicon germanium alloy is used as the material for the first, second and third doped silicon germanium alloy layers (16L, 24L, 32L). The concentration of dopant (p-type or n-type) within the first, second and third doped silicon germanium alloy layers (16L, 24L, 32L) is typically from $1\times10^{19}$ atoms/cm$^3$ to $2\times10^{21}$ atoms/cm$^3$.

The silicon germanium alloy that provides the first, second and third doped silicon germanium alloy layers (16L, 24L, 32L) may have a germanium content that is from 10 atomic percent germanium to 70 atomic percent. Other germanium contents for the silicon germanium alloy that provides the first, second and third doped silicon germanium alloy layers (16L, 24L, 32L) are possible and are thus not excluded from being used in the present application. The various silicon germanium alloy layers may have a same or different type of dopant, and/or a same or different dopant concentration, and/or a same or different germanium content, and/or a same or different thickness.

The first, second and third doped silicon germanium alloy layers (16L, 24L, 32L) can be formed utilizing a deposition process such as, for example CVD or PECVD. The deposition process can include the use of a silicon precursor gas and a germanium containing gas, or a combined silicon-germanium precursor gas. In some embodiments, the dopant can be introduced in-situ during the deposition process. In other embodiments, the dopant can be introduced after the deposition of an intrinsic silicon germanium alloy layer utilizing plasma doping, gas phase doping, ion implantation or dopant diffusion from a sacrificial material that contains the dopant. In some embodiments, an anneal process such as, for example, a laser anneal can be used to activate dopants in the silicon germanium alloy layer(s).

The first, second and third doped silicon germanium alloy layers (16L, 24L, 32L) may have a thickness from 20 nm to 200 nm. Other thicknesses for the first, second and third doped silicon germanium alloy layers (16L, 24L, 32L) are contemplated and can be used as the thickness of the first, second and third doped silicon germanium alloy layers (16L, 24L, 32L).

The phase change memory layer 28L includes a single phase change material or a vertical stack of at least two different phase change materials. The phase change material (s) that provides the phase change memory layer 28L may be composed of a chalcogenide. Chalcogenides are comprised of an element from Group 16 (i.e., a chalcogen) of the Periodic Table of Elements and a more electropositive element. Examples of chalcogens that can be used to provide the phase change material layer 28L include, but are not limited to, a GeSbTe alloy (GST), a SbTe alloy, or an InSe alloy. Other materials can also be used as the first phase change material so long as the other material can retain separate amorphous and crystalline states.

The phase change memory layer 28L can be formed by a deposition process such as, for example, CVD, PECVD or ALD. In some embodiments, the phase change memory layer 28L can have a thickness from 20 nm to 250 nm. Other thicknesses can also be employed as the thickness of the phase change memory layer 28L.

In some embodiments, and as is illustrated in FIG. 1, a selector-containing layer 20 can be present. When present, the selector-containing layer 20L includes at least one of a diode, a threshold switching device, etc. The selector-containing layer 20L can be formed utilizing any suitable process that is well known to those skilled in the art. In some embodiments, transistors (e.g., bipolar junction transistor (BJT) or metal-oxide-semiconductor field effect transistor (MOSFET)) pre-built in the substrate 10 can be used as the selector in lieu of the selector-containing layer 20L.

The second electrically conductive metal or metal alloy containing layer 36L can be composed of any conductive metal or metal alloy. Examples of conductive metals that can be used as the second electrically conductive metal or metal alloy containing layer 36L include, but are not limited to, copper (Cu), aluminum (Al), tungsten (W) or cobalt (Co). An example of a conductive metal alloy that may be used as the second electrically conductive metal or metal alloy containing layer 36L includes a copper-aluminum alloy. The second electrically conductive metal or metal alloy containing layer 36L may include a single layered structure composed entirely of one conductive metal or metal alloy or a multilayered structure containing at least two different conductive materials stacked one atop the other.

The second electrically conductive metal or metal alloy containing layer 36L can be formed utilizing a deposition process such as, for example, CVD, PECVD, ALD, sputtering or plating. The second electrically conductive metal or metal alloy containing layer 36L typically has a thickness from 10 nm to 200 nm; although other thicknesses for the second electrically conductive metal or metal alloy containing layer 36L are contemplated and can be used in the present application.

Referring now to FIG. 2, there is illustrated the exemplary semiconductor structure of FIG. 1 after patterning the PCM material stack 100. In some embodiments, and when present, the second electrically conductive metal or metal alloy containing layer 36L that is located on the PCM material stack 100, and the first electrically conductive metal or metal alloy containing layer 12L, the fifth diffusion barrier layer 14L, the third doped silicon germanium alloy layer 16L, the sixth diffusion barrier layer 18L, and the selector-containing layer 20L that are located beneath the PCM material stack 100 are also patterned during this step of the present application. Although the present application describes and illustrates the formation of a single patterned PCM material stack, the present application contemplates embodiments in which a plurality of spaced apart patterned PCM material stacks are formed.

The patterning can be performed by lithography and etching. Other patterning processes may also be used to pattern the PCM material stack 100 and when present, the second electrically conductive metal or metal alloy containing layer 36L that is located on the PCM material stack 100, and the first electrically conductive metal or metal alloy containing layer 12L, the fifth diffusion barrier layer 14L, the third doped silicon germanium alloy layer 16L, the sixth diffusion barrier layer 18L, and the selector-containing layer 20L that are located beneath the PCM material stack 100.

The remaining PCM material stack 100 after patterning may be referred to as a patterned PCM material stack (or PCM cell) 102. The PCM cell 102 includes a remaining portion of the first diffusion barrier layer 22L (hereinafter referred to a first diffusion barrier material 22), a remaining portion of the first doped silicon germanium alloy layer 24L (hereinafter referred to as a first doped silicon germanium alloy electrode 24), a remaining portion of the second diffusion barrier layer 26L (hereinafter referred to as a second diffusion barrier material 26), a remaining portion of the phase change memory layer 28L (hereinafter referred to as a phase change memory structure 28), a remaining portion of the third diffusion barrier layer 30L (hereinafter referred to a third diffusion barrier material 30), a remaining portion of the second doped silicon germanium alloy layer 32L (hereinafter referred to as a second doped silicon germanium alloy electrode 32), a remaining portion of the fourth diffusion barrier layer 34L (hereinafter referred to as a fourth diffusion barrier material 34). Collectively, the first diffusion barrier material 22, the first doped silicon germanium alloy electrode 24, and the second diffusion barrier material 26 provide a bottom electrode structure of the PCM cell 102, and collectively the third diffusion barrier material 30, the second doped silicon germanium alloy electrode 32, and the fourth diffusion barrier material 34 provide a top electrode structure of the PCM cell 102. In some embodiments, the PCM cell 102 when viewed from a top down view, is circular in shape. Other shapes, such as, for example, square, rectangular, etc., are possible and can be employed in the present application.

If present, and after patterning, a remaining portion of second electrically conductive metal or metal alloy containing layer 36L (hereinafter second electrically conductive metal or metal alloy structure 36) is located above the PCM cell 102, and a remaining portion of the first electrically conductive metal or metal alloy containing layer 12L (hereinafter first electrically conductive metal or metal alloy structure 12), a remaining portion of the fifth diffusion barrier layer 14L (hereinafter fifth diffusion barrier material 14), a remaining portion of the third doped silicon germanium alloy layer 16L (hereinafter a third doped silicon germanium alloy electrode 16), a remaining portion of the sixth diffusion barrier layer 18L (hereinafter sixth diffusion barrier material 18), and a remaining portion of the selector-containing layer 20L (hereinafter selector 20) are located beneath the PCM cell 102. Collectively, the fifth diffusion barrier material 14, the third doped silicon germanium alloy electrode 16, and the sixth diffusion barrier 18 provide a heat loss prevention structure located between the selector 20 and the first electrically conductive metal or metal alloy structure 12.

In some embodiments, the exemplary structure shown in FIG. 2 can be formed by first providing first electrically conductive metal or metal alloy structure 12 on a surface of the semiconductor substrate 10. The first electrically conductive metal or metal alloy structure 12 can be formed first forming a first electrically conductive metal or metal alloy containing layer 12L and then patterning the first electrically conductive metal or metal alloy containing layer 12L by lithography and etching. The other material layers within the exemplary structure can then be formed, and thereafter those other material layers can be patterned.

Figure 3:
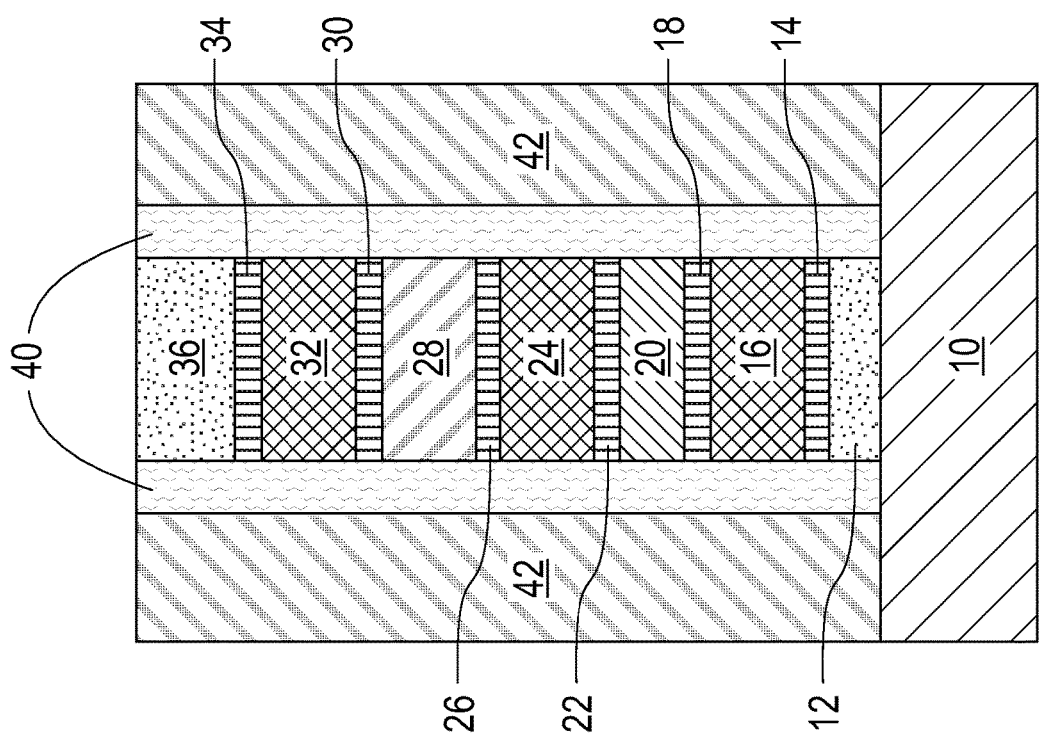
FIG. 3 is a cross sectional view of the exemplary semiconductor structure of FIG. 2 after forming a sacrificial spacer and an interlevel dielectric (ILD) material layer laterally surrounding the patterned PCM material stack.

Referring now to FIG. 3, there is illustrated the exemplary semiconductor structure of FIG. 2 after forming a sacrificial spacer 40 and an interlevel dielectric (ILD) material layer 42 laterally surrounding the patterned PCM material stack (i.e., PCM cell 102). As is shown in the illustrated embodiment, the sacrificial spacer 40 is present directly on the exposed sidewall of the PCM cell 102, and the ILD material layer 42 is located on a sidewall of the sacrificial spacer 40. In embodiments, in which second electrically conductive metal or metal alloy structure 36 is located above the PCM cell 102, and first electrically conductive metal or metal alloy structure 12, fifth diffusion barrier material 14, third doped silicon germanium alloy electrode 16, sixth diffusion barrier material 18, and selector 20 are located beneath the PCM cell 102, the sacrificial spacer 40 is present along an exposed sidewall of those elements as well. Also, and as is shown in the illustrated embodiment, each of the sacrificial spacer 40 and the ILD material layer 42 has a topmost surface that is coplanar with a topmost surface of second electrically conductive metal or metal alloy structure 36. In embodiments, in which no second electrically conductive metal or metal alloy structure 36 is present, each of the sacrificial spacer 40 and the ILD material layer 42 has a topmost surface that is coplanar with a topmost surface of the PCM cell 102.

Sacrificial spacer 40 includes a spacer dielectric material that has a different composition than the dielectric material that provides the ILD material layer 42. In one embodiment, the sacrificial spacer 40 may include, for example, silicon dioxide, silicon nitride or silicon oxynitride. The sacrificial spacer 40 may be formed by first depositing the spacer dielectric material, and thereafter patterning the deposited spacer dielectric material. The depositing of the spacer dielectric material includes CVD, PECVC, PVD or ALD. The patterning of the deposited spacer dielectric material can be performed utilizing a spacer etching process such as, for example, reactive ion etching. The sacrificial spacer 40 may have a lateral thickness, i.e., width, from 5 nm to 30 nm.

In one embodiment, the ILD material layer 42 can be composed silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as ILD material layer 42. The use of a self-planarizing dielectric material as the ILD material layer 42 may avoid the need to perform a subsequent planarizing step. Although not shown, the ILD material layer 42 may comprise a multi-layered structure that includes at least two different dielectric materials stacked one atop the other such as, for example, silicon nitride and silicon dioxide.

In one embodiment, the ILD material layer 42 can be formed utilizing a deposition process including, for example, CVD, PECVD, evaporation or spin-on coating. The thickness of the ILD material layer 42 may vary. A typically thickness from the ILD material layer 42 is from 50 nm to 250 nm. In some embodiments, particularly when non-self-planarizing dielectric materials are used as the ILD material layer 42, a planarization process or an etch back process follows the deposition of the dielectric material that provides the ILD material layer 42.

In one embodiment, the ILD material layer 42 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as the ILD material layer 42, a planarization process or an etch back process follows the deposition of the dielectric material that provides the ILD material.

Figure 4:
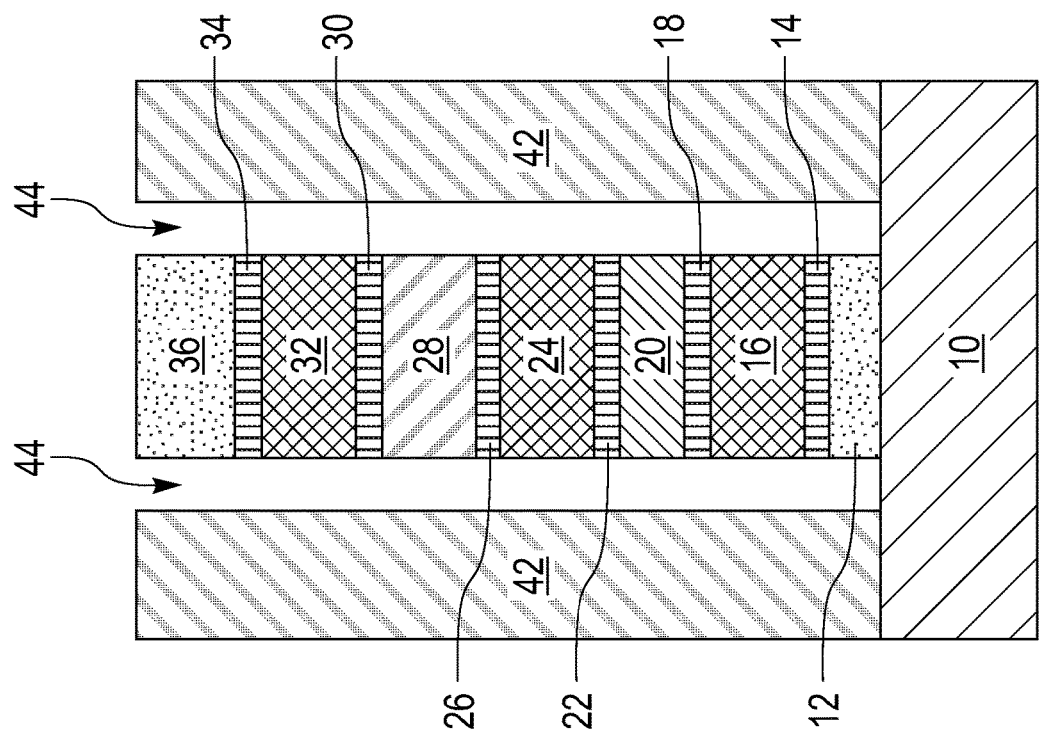
FIG. 4 is a cross sectional view of the exemplary semiconductor structure of FIG. 3 after removing the sacrificial spacer to provide a gap between the ILD material layer and the patterned PCM material stack.

Referring now to FIG. 4, there is illustrated the exemplary semiconductor structure of FIG. 3 after removing the sacrificial spacer 40 to provide a gap 44 between the ILD material layer 42 and PCM stack 102 and, if present between the ILD material layer 42 and second electrically conductive metal or metal alloy structure 36 that is located above the PCM cell 102, and first electrically conductive metal or metal alloy structure 12, fifth diffusion barrier material 14, third doped silicon germanium alloy electrode 16, sixth diffusion barrier material 18, and selector 20 that are located beneath the PCM cell 102.

The sacrificial spacer 40 can be removed utilizing an etching process that is selective in removing the sacrificial spacer material that provides the sacrificial spacer 42. In one example, and when silicon nitride is employed as the sacrificial spacer material for the sacrificial spacer 40, hot phosphoric acid can be used to remove the same from the structure. Gap 44 may, in some embodiments, have an aspect ratio (width to height) of from 1:3 to 1:20. Other aspect ratios are possible for gap 44.

Figure 5:
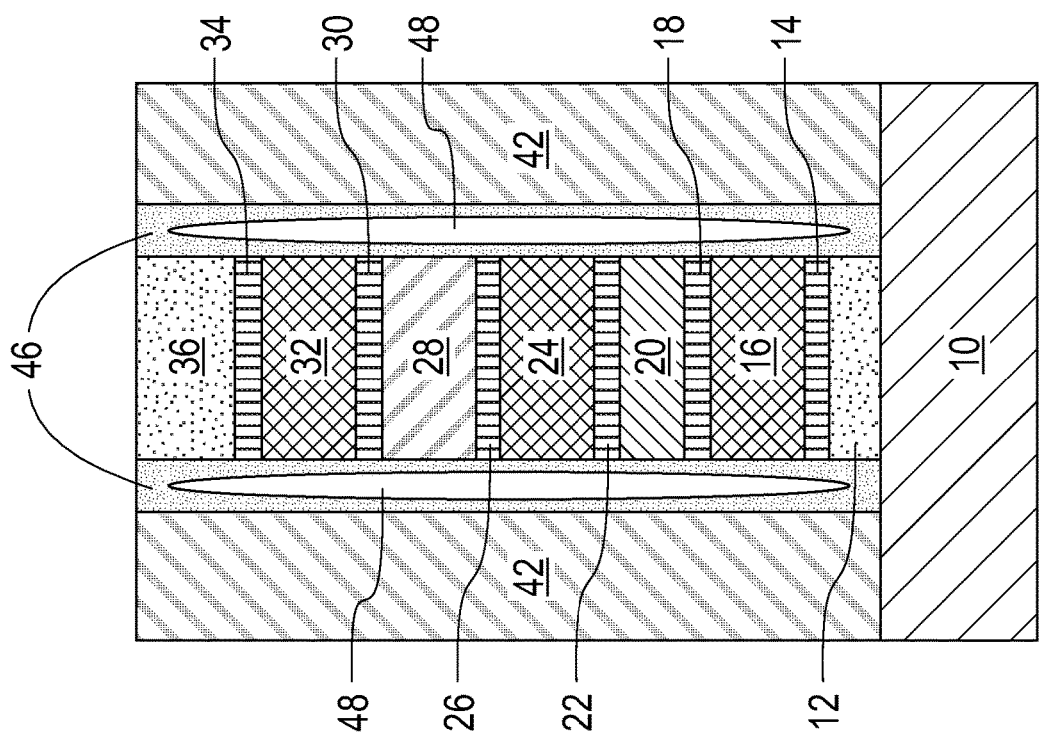
FIG. 5 is a cross sectional view of the exemplary semiconductor structure of FIG. 4 after forming an airgap-containing dielectric spacer in the gap.

Referring now to FIG. 5, there is shown exemplary semiconductor structure of FIG. 4 after forming an airgap-containing dielectric spacer in the gap 44. The airgap-containing dielectric spacer comprises a dielectric material 46 that has an airgap 48 present therein. The dielectric material 46 that provides the airgap-containing dielectric spacer is composed of any dielectric spacer material such as, for example, silicon nitride. The airgap-containing dielectric spacer can be formed utilizing a non-conformal deposition process such as, for example, PECVD. A planarization process may follow the deposition process that provides the airgap-containing dielectric spacer. In some embodiments, the airgap can be formed by first conformally deposited a thin dielectric liner (e.g., 2 nm silicon nitride deposited by ALD) followed by a non-conformal deposition of a dielectric (e.g., silicon nitride deposited by PECVD process) to pinch off the top of the remaining gap to form the airgap 48.

Figure 6A:
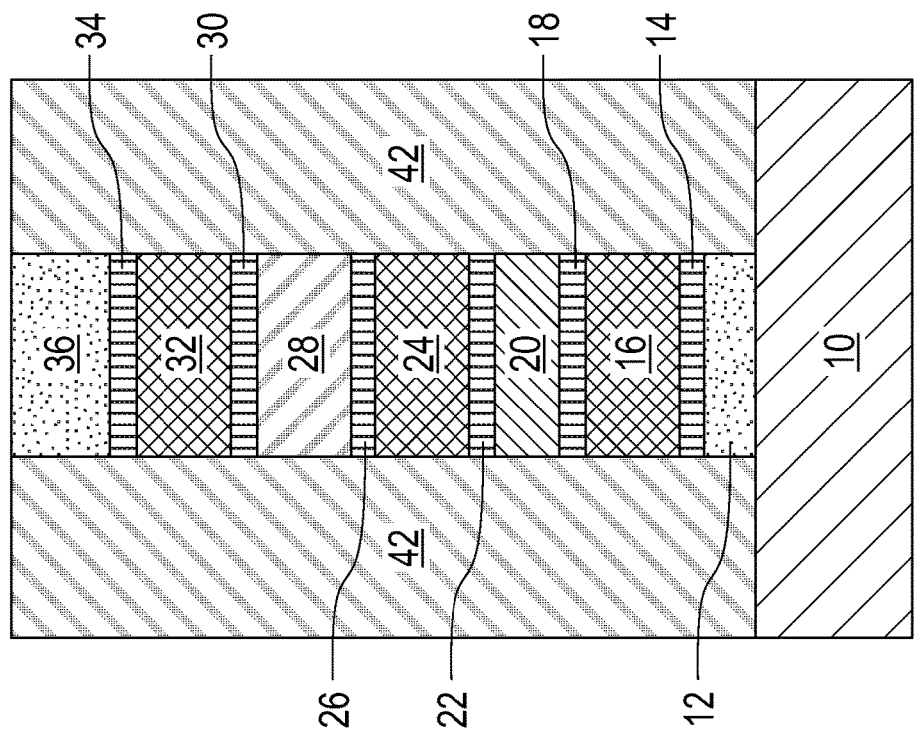
FIGS. 6A-6B are cross sectional views of other exemplary semiconductor structures of the present application in which is no airgap-containing dielectric spacer is formed.
Figure 6B:
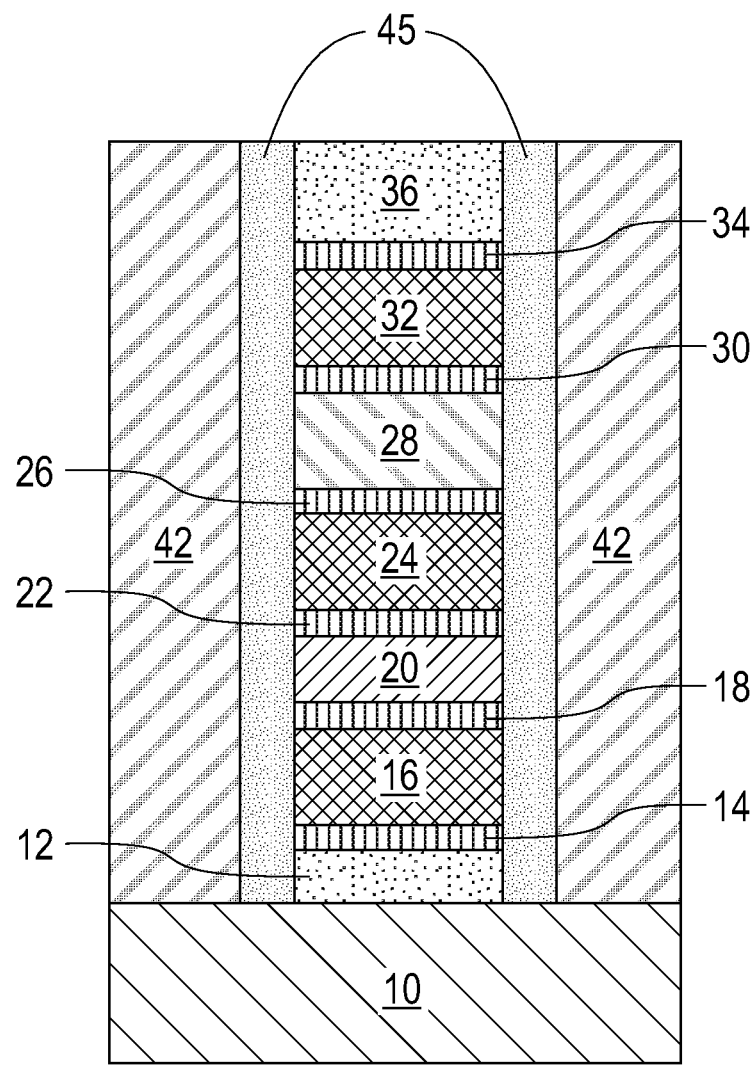

Referring to FIGS. 6A-6B, there are shown other exemplary semiconductor structures of the present application in which is no airgap-containing dielectric spacer is formed. The exemplary semiconductor structure of FIG. 6A includes only the ILD material layer 42 present directly on the exposed sidewall of the patterned PCM cell 102, and is present along an exposed sidewall of second electrically conductive metal or metal alloy structure 36 that is located above the PCM cell 102, and first electrically conductive metal or metal alloy structure 12, fifth diffusion barrier material 14, third doped silicon germanium alloy electrode 16, sixth diffusion barrier material 18, and selector 20 that are located beneath the PCM cell 102. The exemplary semiconductor structure of FIG. 6A can be formed utilizing the basic processing steps describe above with the omission of forming the sacrificial spacer 40, removing the sacrificial spacer and forming the air-gap containing spacer.

The exemplary semiconductor structure of FIG. 6B includes include a permanent spacer 45 present directly on the exposed sidewall of the patterned PCM cell 102, and is present along an exposed sidewall of second electrically conductive metal or metal alloy structure 36 that is located above the PCM cell 102, and first electrically conductive metal or metal alloy structure 12, fifth diffusion barrier material 14, third doped silicon germanium alloy electrode 16, sixth diffusion barrier material 18, and selector 20 that are located beneath the PCM cell 102. The exemplary semiconductor structure of FIG. 6B can be formed by utilizing the basic process steps described above with the exception that the sacrificial spacer 42 is left within the structure to provide the permanent spacer 45 as shown in FIG. 6B.

Notably, FIGS. 5, 6A and 6B illustrate a semiconductor structure in accordance with the present application that includes a phase change memory cell 102 located on a surface of a semiconductor substrate 10. The phase change memory cell 102 includes a phase change material 28 sandwiched between a bottom electrode structure (22/24/26) and a top electrode structure (30/32/34). Each of the bottom electrode structure (22/24/26) and the top electrode structure (30/32/34) of the phase change memory cell 102 includes a doped silicon germanium alloy electrode (24 or 32) positioned between top and bottom diffusion barrier materials (22 and 26 or 30 and 34). Heat loss is mitigated in the phase change memory cell 102 due to the presence of the doped silicon germanium electrodes (24 and 32). Further heat loss is avoided by providing an airgap-containing spacer (46/48) along a sidewall of the phase change memory cell 102.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
a phase change memory cell located on a surface of a semiconductor substrate, wherein the phase change memory cell comprises a phase change material sandwiched between a bottom electrode structure and a top electrode structure, wherein each of the bottom electrode structure and the top electrode structure comprises a doped silicon germanium alloy electrode positioned between a top diffusion barrier material and a bottom diffusion barrier material, wherein the top and bottom diffusion barrier materials are composed of a material that prevents diffusion of dopants from the doped silicon germanium alloy electrode into the phase change material, and the material that prevents diffusion of the dopants is selected from the group consisting of tantalum (Ta), tantalum nitride (TaN), titanium (Ti), titanium nitride (TiN), ruthenium (Ru), ruthenium nitride (RuN), a RuTa alloy, RuTaN, and tungsten nitride (WN).

2. The semiconductor structure of claim 1, wherein the doped silicon germanium alloy comprises an n-type dopant or a p-type dopant.

3. The semiconductor structure of claim 1, wherein the doped silicon germanium alloy is composed of a boron doped silicon germanium alloy.

4. The semiconductor structure of claim 1, further comprising a second electrically conductive metal or metal alloy structure located above the phase change memory cell.

5. The semiconductor structure of claim 4, further comprising a first electrically conductive metal or metal alloy structure and a separator located beneath the phase change memory cell.

6. The semiconductor structure of claim 5, further comprising a heat loss prevention structure located between the first electrically conductive metal or metal alloy structure and the separator, wherein the heat loss prevention structure comprises another doped silicon germanium alloy electrode located between upper and lower diffusion barrier materials.

7. The semiconductor structure of claim 1, further comprising an airgap-containing dielectric spacer located along a sidewall of the phase change memory cell.

8. The semiconductor structure of claim 7, further comprising an interlayer dielectric material layer laterally surrounding the airgap-containing dielectric spacer.

9. The semiconductor structure of claim 1, further comprising a permanent spacer located along a sidewall of the phase change memory cell, and an interlayer dielectric material laterally surrounding the permanent spacer.

10. The semiconductor structure of claim 1, further comprising an interlayer dielectric material along a sidewall of the phase change memory cell.

11. The semiconductor structure of claim 1, wherein the phase change memory cell is circular in shape.

12. A method of forming a semiconductor structure, the method comprising:

provide a phase change memory cell on a surface of a semiconductor substrate, wherein the phase change memory cell comprises a phase change material sandwiched between a bottom electrode structure and a top electrode structure, wherein each of the bottom electrode structure and the top electrode structure comprises a doped silicon germanium alloy electrode positioned between a top diffusion barrier material and a bottom diffusion barrier material, wherein the top and bottom diffusion barrier materials are composed of a material that prevents diffusion of dopants from the doped silicon germanium alloy electrode into the phase change material, and the material that prevents diffusion of the dopants is selected from the group consisting of tantalum (Ta), tantalum nitride (TaN), titanium (Ti), titanium nitride (TiN), ruthenium (Ru), ruthenium nitride (RuN), a RuTa alloy, RuTaN, and tungsten nitride (WN).

13. The method of claim 12, wherein the providing of the phase change memory cell includes forming a second electrically conductive metal or metal alloy structure above the phase change memory cell.

14. The method of claim 13, wherein the providing of the phase change memory cell includes forming a first electrically conductive metal or metal alloy structure and a separator beneath the phase change memory cell, wherein a heat loss prevention structure is positioned between the first electrically conductive metal or metal alloy structure and the separator, wherein the heat loss prevention structure comprises another doped silicon germanium alloy electrode positioned between upper and lower diffusion barrier materials.

15. The method of claim 12, further comprising forming an airgap-containing spacer along a sidewall of the phase change memory cell.

16. The method of claim 15, wherein the forming of the airgap-containing spacer comprises:

forming a sacrificial spacer along the sidewall of the phase change memory cell;

forming an interlayer dielectric material layer laterally surrounding the sacrificial spacer;

removing the sacrificial spacer to provide a gap between the interlayer dielectric material layer and the phase change memory cell; and depositing a dielectric material within the gap.

17. The method of claim 12, further comprising forming a permanent spacer located along a sidewall of the phase change memory cell, and an interlayer dielectric material surrounding the permanent spacer.

18. The method of claim 12, further comprising forming an interlayer dielectric material along a sidewall of the phase change memory cell.

* * * * *